(12) United States Patent
Zhao et al.

(10) Patent No.: US 12,266,547 B1
(45) Date of Patent: Apr. 1, 2025

(54) CLEANING SYSTEM FOR SEMICONDUCTOR

(71) Applicant: Suzhou Zhicheng Semiconductor Technology Co., Ltd., Jiangsu (CN)

(72) Inventors: Tianxiang Zhao, Jiangsu (CN); Shipin Yang, Jiangsu (CN); Shiyu Zhang, Jiangsu (CN); Xianmiao Sun, Jiangsu (CN)

(73) Assignee: Suzhou Zhicheng Semiconductor Technology Co., Ltd., Kunshan (CN)

( * ) Notice: Subject to any disclaimer, the term of this patent is extended or adjusted under 35 U.S.C. 154(b) by 0 days.

(21) Appl. No.: 19/002,655

(22) Filed: Dec. 26, 2024

(30) Foreign Application Priority Data

May 10, 2024 (CN) .......................... 202410573131.2

(51) Int. Cl.
*H01L 21/67* (2006.01)

(52) U.S. Cl.
CPC .............................. *H01L 21/67051* (2013.01)

(58) Field of Classification Search
CPC ................................................ H01L 21/67051
USPC ....................................................... 134/115 R
See application file for complete search history.

(56) References Cited

FOREIGN PATENT DOCUMENTS

| CN | 115020317 A | | 9/2022 |
|---|---|---|---|
| CN | 116174435 B | * | 7/2023 |
| CN | 117855111 A | | 4/2024 |
| WO | 2023045596 A1 | | 3/2023 |

OTHER PUBLICATIONS

CN116174435B—machine translation (Year: 2023).*

* cited by examiner

*Primary Examiner* — Tinsae B Ayalew

(57) ABSTRACT

The present disclosure provides a cleaning system for a semiconductor, including a rotating mechanism, a liquid removing mechanism coaxially arranged on a circumferential outer side of the rotating mechanism, and a cavity mechanism arranged around an outer side of the liquid removing mechanism. The rotating mechanism includes a carrier plate for holding a wafer in a horizontal posture and a transmission unit for driving the carrier plate to rotate axially. The liquid removing mechanism includes a hollow shaft driver sleeved on an outer side of the transmission unit and a liquid guiding ring annularly arranged on a circumferential outer side of the carrier plate and controlled by the hollow shaft driver to rotate along an axial direction. The present disclosure realizes that the cleaning waste liquid is thrown into the cavity mechanism for recycling, to completely recycle the cleaning waste liquid.

8 Claims, 6 Drawing Sheets

CLEANING SYSTEM FOR SEMICONDUCTOR

CROSS-REFERENCE TO RELATED APPLICATION

This application claims priority of Chinese Patent Application No. 202410573131.2, filed on May 10, 2024, the entire contents of which are incorporated herein by reference.

TECHNICAL FIELD

The present disclosure relates to the technical field of semiconductors, and in particular to a cleaning system for a semiconductor.

BACKGROUND

In the semiconductor manufacturing process, cleaning is one of the important steps. The cleaning technology can be divided into wet cleaning and dry cleaning. The wet cleaning involves that organic solvents, acid-base solutions, surfactants or their mixed solutions are used as cleaning solutions, and impurities on a wafer surface react with cleaning solutions to generate soluble substances, gases or directly fall off, achieving an objective of cleaning and ensuring the quality of chips.

The existing wet device requires to be adapted to only one wafer size, but with the increasing demands of semiconductor manufacturers on production efficiency and production cost, new semiconductor wet device often needs to be compatible with different wafer sizes. The wet cleaning usually involves multiple wafer cleaning procedures, with different cleaning waste liquids needing to be recovered in different procedures. To ensure the stability of the wafer in the cleaning process, a motor responsible for rotating the wafer usually maintains at a constant and slow rotation speed.

Chinese invention patent with the publication number of CN116978835B provides a monolithic wafer cleaning device, which includes a wafer rotating mechanism and a composite cavity mechanism coaxially arranged on a circumferential outer side of the wafer rotating mechanism. The composite cavity mechanism includes at least two annular cavities which are stacked inside and outside, and each cavity is arranged with a drainage wall and a shunt base connected to the drainage wall. Independent drainage cavities are enclosed and formed between adjacent cavities, with each drainage cavity having a drainage opening corresponding to a circumferential edge of the wafer. By driving at least one cavity to ascend and descend, the open and close state of each drainage port are switched in different cleaning modes.

However, during the above monolithic wafer cleaning device in the prior art cleaning a wafer with a smaller size, some cleaning waste liquid will be sputtered from an edge of the wafer to the drainage wall, while some will be sputtered to a shielding structure. It is difficult to recover the latter, leading to incomplete recovery of the cleaning waste liquid, and making the above device difficult to be compatible with the cleaning process of wafers with different sizes.

In view of this, it is necessary to improve the monolithic wafer cleaning device in the prior art to solve the above problems.

SUMMARY

An objective of the present disclosure is to provide a cleaning system for a semiconductor, to overcome many defects of a monolithic wafer cleaning device in the prior art, and in particular to realize the complete recovery of cleaning waste liquid sputtered to a shielding structure.

To realize the above objective, the present disclosure provides a cleaning system for a semiconductor, which includes a rotating mechanism, a liquid removing mechanism coaxially arranged on a circumferential outer side of the rotating mechanism, and a cavity mechanism arranged around an outer side of the liquid removing mechanism.

The rotating mechanism includes a carrier plate for holding a wafer in a horizontal posture and a transmission unit for driving the carrier plate to rotate axially.

The liquid removing mechanism includes a hollow shaft driver sleeved on an outer side of the transmission unit and a liquid guiding ring annularly arranged on a circumferential outer side of the carrier plate and controlled by the hollow shaft driver to rotate along an axial direction, and a surface of the liquid guiding ring is convexly arranged upward along the axial direction to form at least one annular liquid blocking part.

In a further improvement of the present disclosure, a surface of the liquid guiding ring is convexly arranged upward along the axial direction to form at least one annular liquid blocking part.

In a further improvement of the present disclosure, the liquid removing mechanism further includes a mounting seat arranged on the outer side of the transmission unit and supporting the hollow shaft driver, and an adapter ring arranged at a top end of the mounting seat along the axial direction and extending through the liquid guiding ring. The adapter ring protrudes outward in a radial direction to form a shielding part extending through the annular liquid blocking part, and a surface of the shielding part is recessed to form a guiding surface for guiding cleaning waste liquid to flow to the liquid guiding ring.

In a further improvement of the present disclosure, a rotating speed of the hollow shaft driver driving the liquid guiding ring to rotate axially is greater than that of the transmission unit driving the carrier plate to rotate axially.

In a further improvement of the present disclosure, the cavity mechanism includes an external recovery cavity, at least one internal recovery cavity coaxially arranged at the external recovery cavity, and a lifting assembly for driving the internal recovery cavity to move longitudinally relative to the external recovery cavity, to collect the cleaning waste liquid through the external recovery cavity and the internal recovery cavity in different cleaning modes.

In a further improvement of the present disclosure, the external recovery cavity and the internal recovery cavity are arranged with a first diversion wall and a second diversion wall, respectively, and a first diversion base and a second diversion base which are connected and linked to the first diversion wall and the second diversion wall, respectively, and a first diversion cavity is formed by enclosure between the external recovery cavity and the internal recovery cavity; a second diversion cavity is formed by enclosure between the internal recovery cavity and the liquid removing mechanism; and a first diversion port and a second diversion port corresponding to a circumferential edge of the wafer are formed on the first diversion cavity and the second diversion cavity, respectively, and the internal recovery cavity is driven to ascend and descend in a longitudinal direction by the lifting assembly to switch open and close states of the first diversion port and the second diversion port in different cleaning modes.

In a further improvement of the present disclosure, the liquid removing mechanism further includes a positioning seat arranged at the mounting seat and formed on a circumferential outer side of the hollow shaft driver.

A radially inner end edge of the first diversion wall is cooperated with a radially inner end edge of the second diversion wall to hide the first diversion port, and a radially outer end edge of the positioning seat is cooperated with the radially inner end edge of the second diversion wall to hide the second diversion port.

In a further improvement of the present disclosure, the rotating mechanism further includes a jack-up unit arranged below the transmission unit, the transmission unit is slidably connected to an inner side of the mounting seat, and a jack-up motor drives the transmission unit to ascend and descend. In a further improvement of the present disclosure, the cleaning system for a semiconductor further includes at least two groups of cleaning mechanisms arranged on a circumferential outer side of the cavity mechanism. Each group of the cleaning mechanisms includes a driving unit, a liquid storage unit and at least two spray pipes, and the driving unit controls the spray pipes to rotate between the wafer and the liquid storage unit.

In a further improvement of the present disclosure, the cleaning system for a semiconductor further includes a fan filter assembly arranged above the rotating mechanism and an air extraction assembly communicated with the cavity mechanism, air is sent into the cavity mechanism after passing through the fan filter assembly, and waste gas in the cavity mechanism is extracted through the air extraction assembly.

In a further improvement of the present disclosure, the cleaning system for a semiconductor further includes a housing, a transmission port arranged on a side of the housing, a shutter plate arranged on an outer side of the transmission port, a driving cylinder for driving the shutter plate to ascend and descend, and an electrostatic eliminator arranged towards the transmission port.

The present disclosure has the following advantages over the prior art. The wafer is held in a horizontal posture by the carrier plate, and driven to rotate axially by the transmission unit, to synchronously drive the wafer to rotate. In the process of cleaning the small-sized wafer, some cleaning waste liquid is sputtered from the edge of the wafer to the cavity mechanism for recycling, and some is sputtered to a surface of the liquid guiding ring, which is driven to rotate axially by the hollow shaft driver, and the cleaning waste liquid on the surface of the liquid guiding ring is thrown into the cavity mechanism for recycling through a centrifugal force generated by the rotation of the liquid guiding ring, to realize complete recycling of cleaning waste liquid and avoid polluting the cavity mechanism and other parts.

DETAILED DESCRIPTION

The present disclosure will be described in detail with reference to various embodiments shown in the attached drawings, but it is to be noted that these embodiments are not intended to limit the present disclosure. Equivalent transformations or substitutions in functions, methods, or structures made by those ordinary skilled in the field according to these embodiments all fall within the scope of protection of the present disclosure.

In particular, in the following examples, the term "axially" refers to the direction indicated by a central axis P in FIG. 1.

Please refer to a specific embodiment of a cleaning system for a semiconductor provided by FIG. 1 to FIG. 6.

Figure 1:
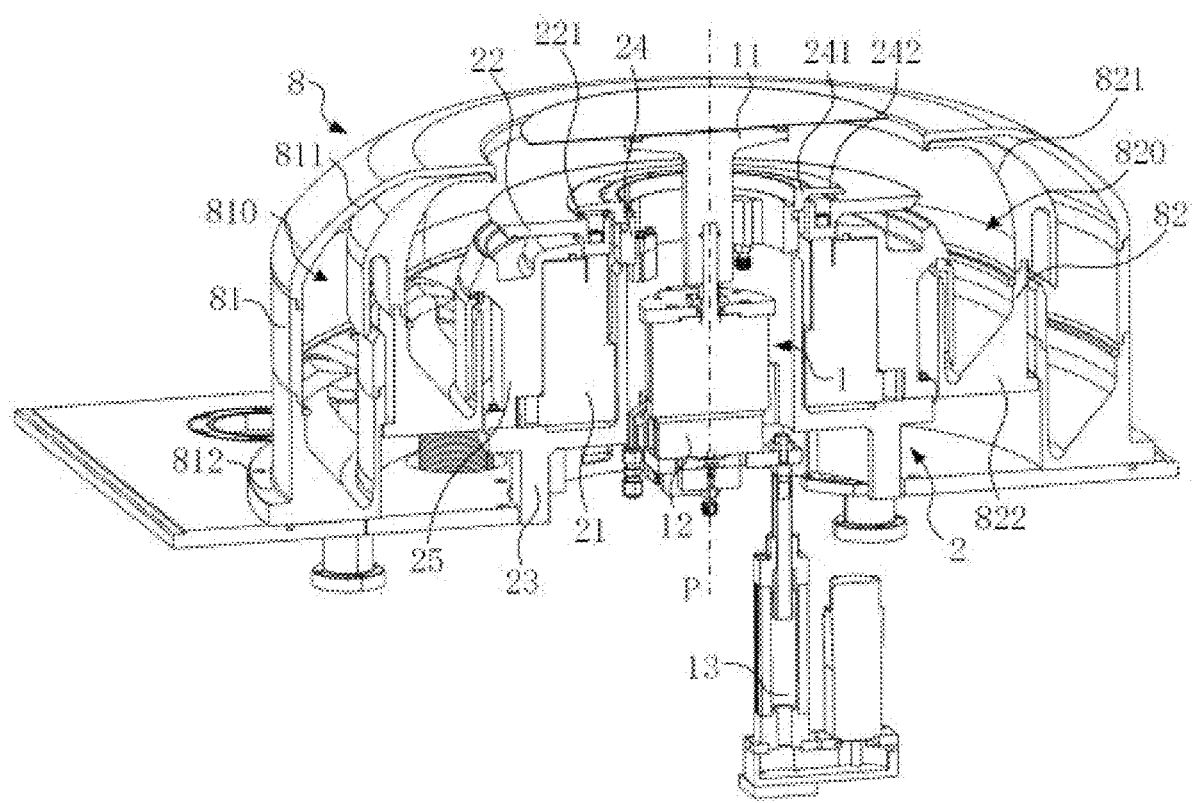
FIG. 1 is a perspective cross-sectional view of a connection between a rotating mechanism and a liquid removing mechanism included in a cleaning system for a semiconductor provided by the present disclosure.
Figure 2:
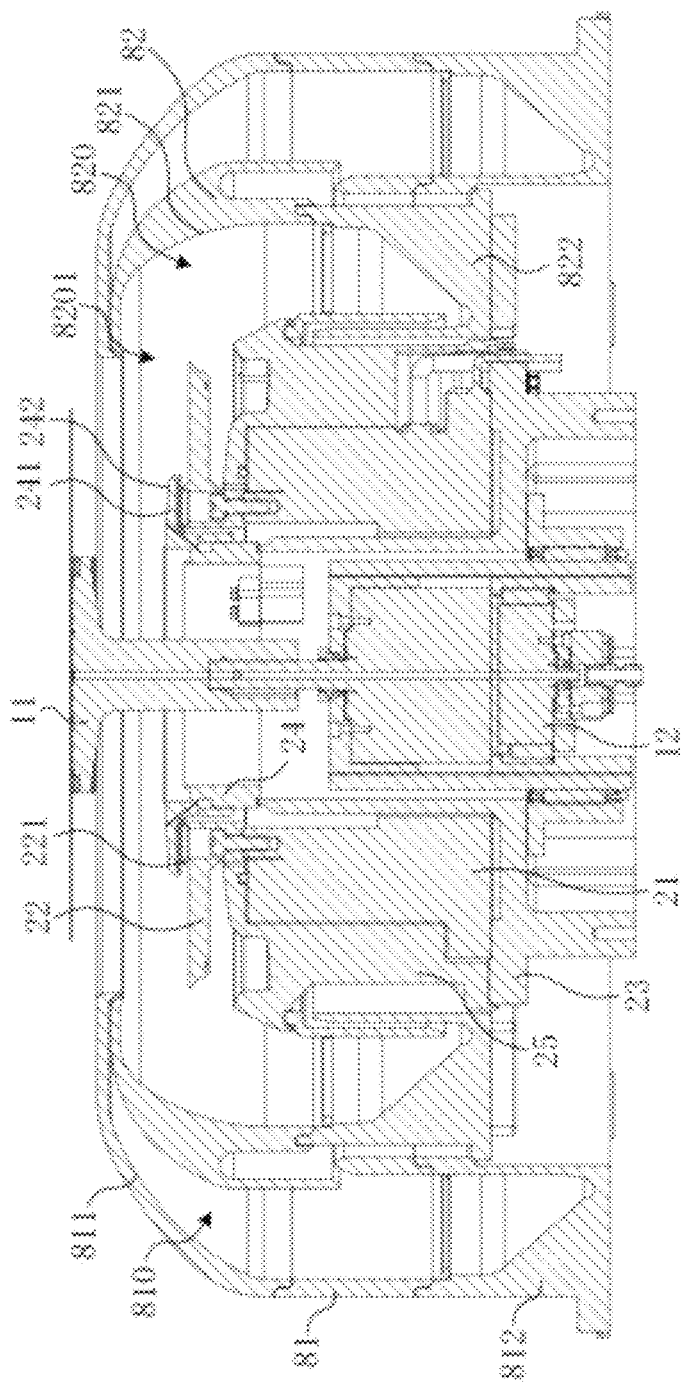
FIG. 2 is a cross-sectional view of a connection between the liquid removing mechanism and a cavity mechanism provided by the present disclosure.
Figure 3:
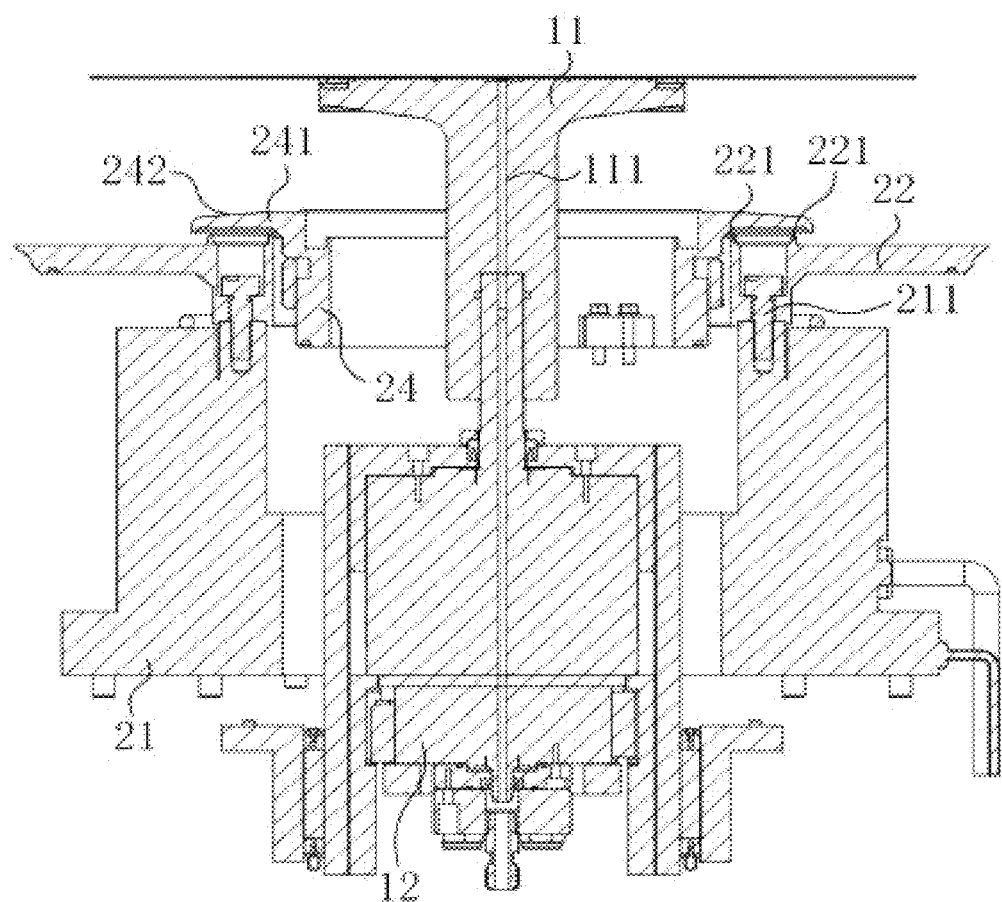
FIG. 3 is a cross-sectional view of a connection between the rotating mechanism and the liquid removing mechanism provided by the present disclosure.

Referring to FIGS. 1-3, in this embodiment, the cleaning system for a semiconductor 100 includes a rotating mechanism 1, a liquid removing mechanism 2 arranged around a circumferential outer side of the rotating mechanism 1, and a cavity mechanism 8 arranged around an outer side of the liquid removing mechanism 2. The rotating mechanism 1 includes a carrier plate 11 for holding a wafer in a horizontal posture and a transmission unit 12 for driving the carrier plate 11 to rotate axially. A hollow shaft motor is preferably selected as the transmission unit 12, and an air pipe 111 is arranged in a center of the carrier plate 11. The carrier plate 11 adsorbs and fixes the wafer through the air pipe 111, and the air pipe 111 passes through a central shaft of the transmission unit 12, to prevent the carrier plate 11 from affecting the adsorption strength of the air pipe 111 to the wafer during the rotation.

Referring to FIG. 1 and FIG. 2, the liquid removing mechanism 2 includes a hollow shaft driver 21 sleeved on an outer side of the transmission unit 12 and a liquid guiding ring 22 annularly arranged on a circumferential outer side of the carrier plate 11 and controlled by the hollow shaft driver 21 to rotate along an axial direction. The hollow shaft motor is preferably selected as the hollow shaft driver 21, and a hollow shaft (not labeled) of the hollow shaft driver 21 is arranged around the outer side of the carrier plate 11 and connected to the liquid guiding ring 22. In the process of wafer cleaning by the cleaning system for a semiconductor 100, the wafer is sucked and fixed in a horizontal posture through the carrier plate 11, and the carrier plate 11 is driven to rotate axially through the transmission unit 12 to synchronously drive the wafer to rotate. When the wafer size is larger, the cleaning waste liquid on the wafer surface may be directly sputtered to the cavity mechanism 8 for recycling through a centrifugal force generated by the wafer rotation. When the wafer size is smaller, a centrifugal force generated by the rotation of the wafer may sputter some cleaning waste liquid on the wafer surface to the cavity mechanism 8 for recycling, and some is sputtered to a surface of the liquid guiding ring 22. Meanwhile, the hollow shaft driver 21 drives the liquid guiding ring 22 to rotate axially, and the centrifugal force generated by the rotation of the liquid guiding ring 22 directly throws the cleaning waste liquid on the surface of the liquid guiding ring 22 into the cavity mechanism 8 for recycling. By driving the liquid guiding ring 22 to rotate, the cleaning system for a semiconductor 100 solves the technical problem that it is difficult to recover the cleaning waste liquid sputtered to a surface of the shielding structure when a monolithic wafer cleaning device in the prior art cleans the wafer with smaller size, resulting in incomplete recovery of the cleaning waste liquid. The cleaning system for a semiconductor 100 may be compatible with the cleaning processes of wafers with different sizes, and may completely recover the cleaning waste liquid to avoid polluting the rotating mechanism 1 and other parts.

Further, referring to FIG. 3, a surface of the liquid guiding ring 22 is convexly arranged upward along the axial direction to form at least one annular liquid blocking part 221. The annular liquid blocking part 221 blocks the cleaning waste liquid splashed onto the surface of the liquid guiding ring 22, preventing the cleaning waste liquid from flowing to a radial inner side of the liquid guiding ring 22 and polluting the rotating mechanism 1 and other parts. In this embodiment, preferably, two groups of annular liquid blocking parts 221 arranged at intervals are formed on the surface of the liquid guiding ring 22 by protruding upward in the axial direction. One of the annular liquid blocking parts 221 is formed at an inner edge of the liquid guiding ring 22. A space is formed between the two groups of annular liquid blocking parts 221, and serves for connecting the liquid guiding ring 22 to a hollow shaft of the hollow shaft driver 21 via a bolt 211

Further, referring to FIGS. 1-3, the liquid removing mechanism 2 further includes a mounting seat 23 arranged on the outer side of the transmission unit 12 and supporting the hollow shaft driver 21, and an adapter ring 24 arranged at a top end of the mounting seat 23 along the axial direction and extending through the liquid guiding ring 22. The adapter ring 24 protrudes outward in a radial direction to form a shielding part 241 extending through the annular liquid blocking part 221, and a surface of the shielding part 241 is recessed to form a guiding surface 242 for guiding cleaning waste liquid to flow to the liquid guiding ring 22. The adapter ring 24 is spaced from the liquid guiding ring 22, and the liquid guiding ring 22 rotates relative to the adapter ring 24. When the cleaning system for a semiconductor 100 cleans the wafer with smaller sizes, the shielding part 241 may shield the cleaning waste liquid sputtered to the radial inner side of the liquid guiding ring 22, and the guiding surface 242 guides the cleaning waste liquid to the surface of the liquid guiding ring 22 which belongs to a radial outer side of the annular liquid blocking part 221, and the cleaning waste liquid is thrown into the cavity mechanism 8 through the liquid guiding ring 22 for recycling, avoiding incomplete recycling of the cleaning waste liquid and further preventing the cleaning waste liquid from polluting the rotating mechanism 1 and other parts. It is to be noted that the guiding surface 242 may be arranged as an inclined surface with an inclined angle, an arc surface, or a combination of the inclined surface and the arc surface, but it is not limited to this, as long as it may guide the cleaning waste liquid to flow to the surface of the liquid guiding ring 22 which belongs to the radially outer side of the annular liquid blocking part 221.

Specifically, a rotating speed of the hollow shaft driver 21 driving the liquid guiding ring 22 to rotate axially is greater than that of the transmission unit 12 driving the carrier plate 11 to rotate axially. To ensure the stability of a wafer in the cleaning process, an axial rotation speed of the carrier plate 11 is slow. To ensure that the liquid guiding ring 22 is capable of fully throwing out the cleaning waste liquid from the surface, a rotation speed of the liquid guiding ring 22 is higher than that of the carrier plate 11.

Specifically, referring to FIG. 1 and FIG. 2, the cavity mechanism 8 includes an external recovery cavity 81, at least one internal recovery cavity 82 coaxially arranged inside the external recovery cavity 81, and a lifting assembly 83 for driving the internal recovery cavity 82 to move longitudinally relative to the external recovery cavity 81, to collect the cleaning waste liquid through the external recovery cavity 81 and the internal recovery cavity 82 in different cleaning modes. In this embodiment, the cavity mechanism 8 arranged with the external recovery cavity 81 and one internal recovery cavity 82 is taken as an example. The internal recovery cavity 82 is driven to move longitudinally upward relative to the external recovery cavity 81 by the lifting assembly 83 to recover the first cleaning waste liquid through the internal recovery cavity 82, and the internal recovery cavity 82 is driven to move longitudinally downward relative to the external recovery cavity 81 by the lifting assembly 83 to recover the second cleaning waste liquid through the external recovery cavity 81. Given that the lifting assembly 83 is not the core inventive point of the present application, the description thereof is omitted in this example, and any driving structure that is capable of driving the internal recovery cavity 82 to move longitudinally relative to the external recovery cavity 81 in the prior art may be adopted.

Specifically, referring to FIG. 1 and FIG. 2, the external recovery cavity 81 and the internal recovery cavity 82 are arranged with a first diversion wall 811 and a second diversion wall 821, respectively, and a first diversion base 812 and a second diversion base 822 which are connected and linked to the first diversion wall 811 and the second diversion wall 821, respectively, and a first diversion cavity 810 is formed by enclosure between the external recovery cavity 81 and the internal recovery cavity 82. A second diversion cavity 820 is formed by enclosure between the internal recovery cavity 82 and the liquid removing mechanism 2. A first diversion port and a second diversion port 8201 corresponding to a circumferential edge of the wafer are formed on the first diversion cavity 810 and the second diversion cavity 820, respectively, and the internal recovery cavity 82 is driven to ascend and descend in a longitudinal direction by the lifting assembly 83 to switch open and close states of the first diversion port and the second diversion port 8201 in different cleaning modes.

For example, in a first cleaning mode, upon the lifting assembly 83 driving the internal recovery cavity 82 to rise to an upper limit (seen in FIG. 2), the first diversion port is closed. The second diversion port 8201 is formed by a radial inner end edge of the second diversion wall 821 and a circumferential edge of the liquid guiding ring 22. To facilitate smooth diversion, the second diversion wall 821 is constructed as an arc-shaped structure extending from the lateral direction to the longitudinal direction and from the radially inner side to the radially outer side. During the cleaning in which the circumferential edge of the wafer is aligned with the second diversion port 8201 (this state is not shown), some cleaning waste liquid on the wafer surface is sputtered to the second diversion wall 821 through the second diversion port 8201 by the centrifugal force generated by the rotation of the wafer, and the cleaning waste liquid on the surface of the liquid guiding ring 22 is directly thrown into the second diversion wall 821 by the centrifugal force generated by the rotation of the liquid guiding ring 22. The liquid is diverted from top to bottom through the second diversion wall 821, and flows to the second diversion base 822 and is discharged. For example, in a second cleaning mode, upon the lifting assembly 83 driving the internal recovery cavity 82 to descend to a lower limit (this state is not shown), the second diversion port 8201 is closed. The first diversion port (not labeled) is formed by the cooperating of a radially inner end edge of the first diversion wall 811 and a radially inner end edge of the second diversion wall 821. To facilitate smooth diversion, the first diversion wall 811 is constructed as an arc-shaped structure extending from the lateral direction to the longitudinal direction and from the radially inner side to the radially outer side. During the cleaning in which the circumferential edge of the wafer is aligned with the first diversion port (this state is not shown), some cleaning waste liquid on the wafer surface is sputtered to the first diversion wall 811 through the first diversion port by centrifugal force generated by the rotation of the wafer, and the cleaning waste liquid on the surface of the liquid guiding ring 22 is directly thrown into the first diversion wall 811 through the first diversion port by centrifugal force generated by the rotation of the liquid guiding ring 22, diverted from top to bottom through the first diversion wall 811, and discharged to the first diversion base 812.

Further, referring to FIG. 1 and FIG. 2, the liquid removing mechanism 2 further includes a positioning seat 25 arranged at the mounting seat 23 and formed on a circumferential outer side of the hollow shaft driver 21. A radially inner end edge of the first diversion wall 811 is cooperated with a radially inner end edge of the second diversion wall 821 to hide the first diversion port, and a radially outer end edge of the positioning seat 25 is cooperated with the radially inner end edge of the second diversion wall 821 to hide the second diversion port 8201. In this example, the internal recovery cavity 82, the positioning seat 25 and the liquid guiding ring 22 together form the second diversion cavity 820, and the second diversion cavity 820 and the first diversion cavity 810 are independent of each other and completely separated. In the second cleaning mode, upon the internal recovery cavity 82 descending to the lower limit (this state is not shown), an upper edge of the positioning seat 25 cooperates with a radially inner edge of the second diversion wall 821 to hide and close the second diversion port 8201. Meanwhile, the first diversion port is opened to the maximum state, and the wafer and the guiding ring 22 may sputter the cleaning waste liquid into the first diversion cavity 810. A matching structure of the positioning seat 25 and the second diversion wall 821 can effectively prevent different cleaning waste liquid from mixing after entering the second diversion cavity 820. In the first cleaning mode, upon the internal recovery cavity 82 rising to the upper limit (as shown in FIG. 2), the radially inner end edge of the first diversion wall 811 cooperates the radially inner end edge of the second diversion wall 821 to hide and close the first diversion port. Meanwhile, the second diversion port 8201 is opened to the maximum state, and the wafer and the liquid guiding ring 22 may sputter the cleaning waste liquid into the second diversion cavity 820. A matching structure of the first diversion wall 811 and the second diversion wall 821 can effectively prevent different cleaning waste liquid from mixing after entering the first diversion cavity 810.

Specifically, referring to FIG. 1, the rotating mechanism 1 further includes a jack-up unit 13 arranged below the transmission unit 12, the transmission unit 12 is slidably connected to an inner side of the mounting seat 23, and a jack-up motor drives the transmission unit 12 to ascend and descend. A sliding rail (not labeled) is arranged on the inner side of the mounting seat 23, and the transmission unit 12 is connected to the sliding rail by a slider (not labeled), and the jack-up unit 13 may drive the transmission unit 12 to longitudinally lift, and the rotating mechanism 1 may drive the wafer to rotate and lift. The transmission unit 12 is driven by the jack-up unit 13 to lift the carrier plate 11 synchronously. Before cleaning, the carrier plate 11 is driven to rise to a high position, and the wafer is transported by a manipulator (not shown) or other wafer transport devices (not shown) to be placed on the carrier plate 11. The carrier plate 11 is fixed by adsorption, and the carrier plate 11 is driven to lower the wafer to a position corresponding to the first diversion port or the second diversion port 8201 for cleaning.

Figure 5:
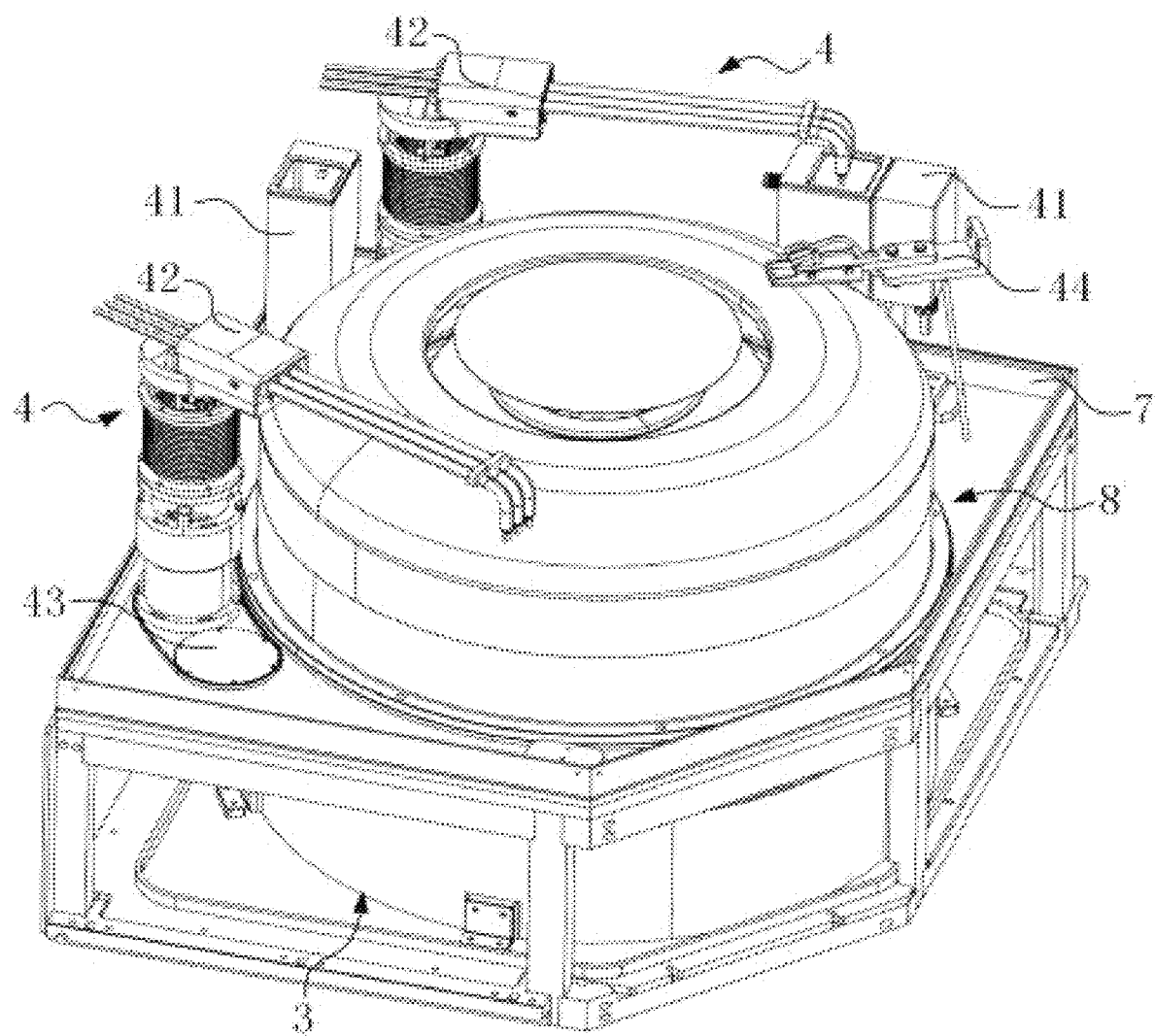
FIG. 5 is a schematic diagram of a connection between the cavity mechanism and a cleaning mechanism.

Specifically, referring to FIG. 5, the cleaning system for a semiconductor 100 further includes at least two groups of cleaning mechanisms 4 arranged on a circumferential outer side of the cavity mechanism 8. Each group of the cleaning mechanisms 4 includes a driving unit 43, a liquid storage unit 41 and at least two spray pipes 42, and the driving unit 43 controls the spray pipes 42 to rotate between the wafer and the liquid storage unit 41. The two groups of the cleaning mechanisms 4 correspond to the first cleaning mode and the second cleaning mode. Cleaning solutions sprayed by the two groups of the cleaning mechanisms 4 are different, and each of the spray pipes 42 has three nozzles, namely a cleaning solution pipe (not labeled), a pure water pipe (not labeled) and a nitrogen pipe (not labeled). At the end of each cleaning mode, the driving unit 43 controls the spray pipes 42 to rotate until the nozzles of the spray pipe 42 are aligned with the liquid storage unit 41, and the cleaning solution or pure water overflowing from the nozzles of the spray pipes 42, after the liquid supply of the spray pipes 42 is stopped, is collected into the liquid storage unit 41 to avoid polluting the cavity mechanism 8 and other parts. The cleaning system for a semiconductor 100 further includes a pure water spray pipe 44 for pre-wetting the wafer surface or performing supplementary cleaning to obtain wafers with high cleanliness requirements. For example, the pure water spray pipe 44 is arranged on an outer side the cavity mechanism 8, and a nozzle of the pure water spray pipe 44 extends above the wafer.

Figure 4:
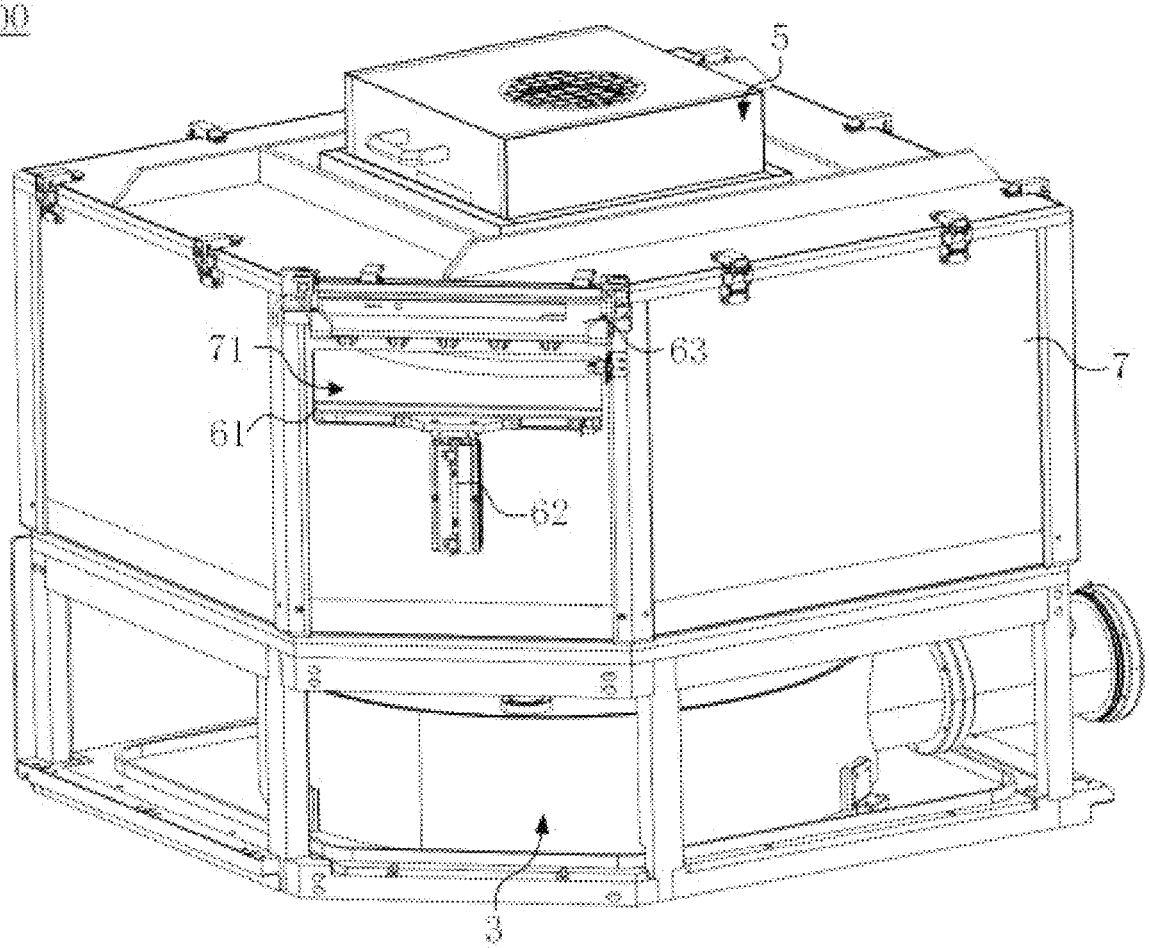
FIG. 4 is an overall view of the cleaning system for a semiconductor provided by the present disclosure.
Figure 6:
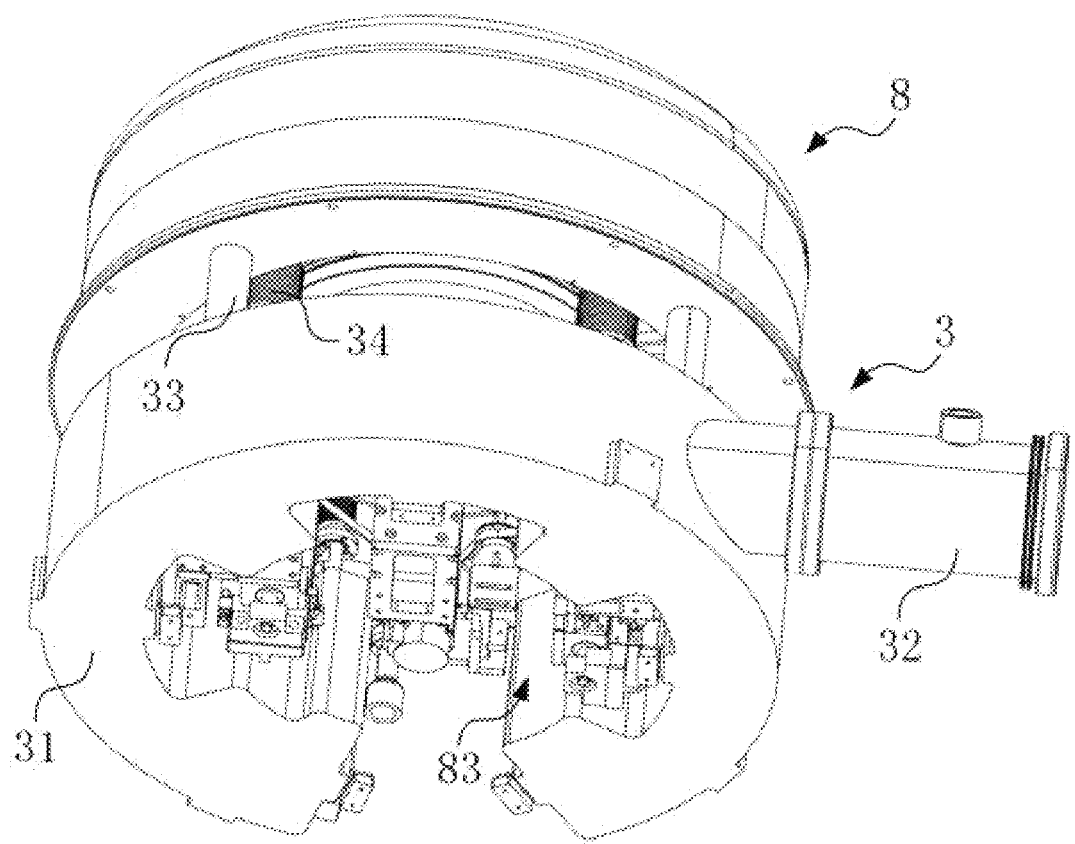
FIG. 6 is a schematic diagram of a connection between an air extraction assembly and the cavity mechanism.

Referring to FIG. 4 and FIG. 6, the cleaning system for a semiconductor 100 further includes a fan filter assembly 5 arranged above the rotating mechanism 1 and an air extraction assembly 3 communicated with the cavity mechanism 8. Air is sent into the cavity mechanism 8 after passing through the fan filter assembly 5, and waste gas in the cavity mechanism 8 is extracted by means of the air extraction assembly 3. The fan filter assembly 5 is arranged above the rotating mechanism 1, and the fan filter assembly 5 filters the air and sends it into the cavity mechanism 8. The air extraction assembly 3 includes an air extraction cavity 31, an air extraction pipe 32 communicated with the air extraction cavity 31, a plurality of exhaust pipes 33 arranged on an upper surface of the air extraction cavity 31, and corrugated pipes 34. The air extraction cavity 31 is formed below the cavity mechanism 8, the exhaust pipes 33 are connected to the external recovery cavity 81 to communicate with the first diversion cavity 810, the corrugated pipes 34 are connected to the internal recovery cavity 82 to communicate with the second diversion cavity 820, and the air extraction pipe 32 is connected to an external air pump (not shown) to exhaust the waste gas in the cavity mechanism 8 by means of the air extraction assembly 3.

Referring to FIG. 4, the cleaning system for a semiconductor 100 further includes a housing 7, a transmission port 71 arranged at a side of the housing, a shutter plate 61 arranged on an outer side of the transmission port 71, a driving cylinder 62 for driving the shutter plate 61 to ascend and descend, and an electrostatic eliminator 63 arranged towards the transmission port 71. The shutter plate 61 is controlled to ascend and descend in the longitudinal direction by the driving cylinder 62, to control the opening and closing of the transmission port 71. The electrostatic eliminator 63 is configured to eliminate the static electricity on the wafer surface before and after cleaning, and prevent the electrostatic adsorption of fine pollutants.

Cleaning steps of the cleaning system for a semiconductor 100 provided by this example are as follows: in an initial stage, the cavity mechanism 8 is in a low position, and the carrier plate 11 is in a high position (a distance higher than an upper end surface of the cavity mechanism 8). Before cleaning, the wafer is delivered from the transmission port 71 by the manipulator. During the delivery, the static electricity on the surface of the wafer is removed by the electrostatic eliminator 63, and the wafer is placed on the carrier plate 11. The wafer is fixed by the carrier plate 11, and the driving unit 12 is driven to descend by the jack-up unit 13 to synchronously drive the carrier plate 11 to descend to the low position (this state is not shown). Meanwhile, the transmission port 71 is closed by the driving cylinder 62 driving the shutter plate 61 to ascend. Before the wafer enters the first cleaning mode or the second cleaning mode, pure water is sprayed through the pure water spray pipe 44 to pre-wet the wafer surface.

In the first cleaning mode, the internal recovery cavity 82 is driven by the lifting assembly 83 to ascend to the upper limit (as shown in FIG. 2), the corrugated pipes 34 are stretched, and the radially inner end edge of the first diversion wall 811 is cooperated with the radially inner end edge of the second diversion wall 821 to hide and close the first diversion port. Meanwhile, the second diversion port 8201 is opened to the maximum state, and the circumferential edge of the wafer is aligned with the second diversion port 8201. The wafer is driven by the transmission unit 12 to rotate, and the first cleaning solution, the pure water and nitrogen are sprayed sequentially by the spray pipe 42 to clean and dry the wafer surface. If the wafer size is larger, the cleaning waste liquid generated in the first cleaning mode will be directly sputtered by the wafer edge to the second diversion wall 821 along with the rotation of the wafer, and diverted from top to bottom through the second diversion wall 821, and discharged to the second diversion base 822 for recycling. If the wafer size is smaller, some cleaning waste liquid will be sputtered to the surface of the liquid guiding ring 22. Meanwhile, the liquid guiding ring 22 is driven by the hollow shaft driver 21 to rotate axially, and the cleaning waste liquid on the surface of the liquid guiding ring 22 is directly thrown into the second diversion wall 821 by the centrifugal force generated by the rotation of the liquid guide ring 22 for recycling. Meanwhile, the external air pump starts to work, and the waste gas in the second diversion cavity 820 is pumped out through the corrugated pipes 34, and clean air filtered by the fan filter assembly 5 enters the second diversion cavity 820.

In the second cleaning mode, upon the lifting assembly 83 driving the internal recovery cavity 82 to descend to the lower limit (this state is not shown), the corrugated pipes 34 are contracted, and the upper edge of the positioning seat 25 is cooperated with the radially inner edge of the second diversion wall 821 to hide and close the second diversion port 8201. Meanwhile, the first diversion port is opened to the maximum state, and the circumferential edge of the wafer is aligned with the first diversion port. The wafer is driven by the transmission unit 12 to rotate, and the first cleaning solution, the pure water and the nitrogen are sequentially sprayed by the spray pipe 42 to clean and dry the wafer surface. If the wafer size is larger, the cleaning waste liquid generated in the first cleaning mode will be directly sputtered to the first diversion wall 811 by the wafer edge along with the rotation of the wafer, and guided from top to bottom through the first diversion wall 811, and discharged to the first diversion base 812 for recycling. If the wafer size is smaller, some cleaning waste liquid will be sputtered to the surface of the liquid guiding ring 22. Meanwhile, the liquid guiding ring 22 is driven by the hollow shaft driver 21 to rotate axially, the cleaning waste liquid on the surface of the liquid guiding ring 22 is directly thrown into the first diversion wall 811 for recycling by the centrifugal force generated by the rotation of the liquid guiding ring 22. Meanwhile, the external air pump starts to work, and the waste gas in the first diversion cavity 810 is pumped out through the exhaust pipe 33, and the clean air filtered by the fan filter assembly 5 enters the first diversion cavity 810.

Finally, the carrier plate 11 is ascended to a high position, the shutter plate 61 is driven by the driving cylinder 62 to descend to open the transmission port 71, and the manipulator reaches in to take out the cleaned wafer. The cleaning system for a semiconductor 100 provided by the present disclosure has a compact structure, and different cleaning solutions may be used for segmented cleaning in different cavities (namely, the external recovery cavity 81 and the internal recovery cavity 82) of the same cleaning system for a semiconductor 100. The cleaning waste liquid and waste gas generated in different cavities are discharged through the diversion bases with liquid-gas separation structures (namely, the first diversion base 812 and the second diversion base 822), making the cleaned wafer have a higher cleanliness. On the basis of the above, by driving the liquid guiding ring 22 to rotate, the cleaning system for a semiconductor 100 solves the technical problem that the cleaning waste liquid sputtered to the surface of the shielding structure is difficult to recover when the wafer with a smaller size is cleaned by the monolithic wafer cleaning device in the prior art, resulting in incomplete recovery of the cleaning waste liquid. Therefore, the cleaning system for a semiconductor 100 is allowed to be compatible with the cleaning processes of the wafers with different sizes, and adapt to the wafers with different sizes to recover the cleaning waste liquid, realizing the complete recovery of cleaning waste liquid, avoiding polluting the rotating mechanism 1 and other parts, and improving the cleaning efficiency of the cleaning system for a semiconductor 100.

The series of detailed descriptions listed above are only specific descriptions of feasible embodiments of the present disclosure, and they are not used to limit the scope of protection of the present disclosure. Any equivalent embodiments or changes that do not depart from the technical spirit of the present disclosure are to be included in the scope of protection of the present disclosure.

It is obvious to those skilled in the art that the present disclosure is not limited to the details of the above-mentioned exemplary examples, but can be realized in other specific forms without departing from the spirit or essential characteristics of the present disclosure. Therefore, the example are to be considered in all aspects as illustrative and not restrictive, and the scope of the present disclosure is defined by the appended claims rather than the above description, so it is intended to embrace all changes that fall within the meaning and range of equivalents of the claims. Any reference signs in the claims are not to be construed as limiting the claims concerned.

In addition, it is to be understood that although this specification is described according to embodiment, not each embodiment only includes an independent technical solution, and the specification is described in such a manner only for the sake of clarity. Those skilled in the art are to be taken the specification as a whole, and the technical solutions in various examples may also be appropriately combined to form other examples that may be understood by those skilled in the art.

The invention claimed is:

1. A cleaning system for a semiconductor, comprising:
a rotating mechanism, a liquid removing mechanism coaxially arranged on a circumferential outer side of the rotating mechanism, and a cavity mechanism arranged around an outer side of the liquid removing mechanism, wherein
the rotating mechanism comprises a carrier plate for holding a wafer in a horizontal posture and a transmission unit for driving the carrier plate to rotate axially;
the liquid removing mechanism comprises a hollow shaft driver sleeved on an outer side of the transmission unit and a liquid guiding ring annularly arranged on a circumferential outer side of the carrier plate and controlled by the hollow shaft driver to rotate along an axial direction, and a surface of the liquid guiding ring is convexly arranged upward along the axial direction to form at least one annular liquid blocking part;
the liquid removing mechanism further comprises a mounting seat arranged on the outer side of the transmission unit and supporting the hollow shaft driver, and an adapter ring arranged at a top end of the mounting seat along the axial direction and extending through the liquid guiding ring, wherein the adapter ring protrudes outward in a radial direction to form a shielding part extending through the annular liquid blocking part, and a surface of the shielding part is recessed to form a guiding surface for guiding cleaning waste liquid to flow to the liquid guiding ring; and
the cavity mechanism comprises an external recovery cavity, at least one internal recovery cavity coaxially arranged at the external recovery cavity, and a lifting assembly for driving the internal recovery cavity to move longitudinally relative to the external recovery cavity, to collect the cleaning waste liquid through the external recovery cavity and the internal recovery cavity in different cleaning modes.

2. The cleaning system for a semiconductor according to claim 1, wherein a rotating speed of the hollow shaft driver driving the liquid guiding ring to rotate axially is greater than that of the transmission unit driving the carrier plate to rotate axially.

3. The cleaning system for a semiconductor according to claim 1, wherein the external recovery cavity and the internal recovery cavity are arranged with a first diversion wall and a second diversion wall, respectively, and a first diversion base and a second diversion base which are connected and linked to the first diversion wall and the second diversion wall, respectively, and a first diversion cavity is formed by enclosure between the external recovery cavity and the internal recovery cavity; a second diversion cavity is formed by enclosure between the internal recovery cavity and the liquid removing mechanism; and a first diversion port and a second diversion port corresponding to a circumferential edge of the wafer are formed on the first diversion cavity and the second diversion cavity, respectively, and the internal recovery cavity is driven to ascend and descend in a longitudinal direction by the lifting assembly to switch open and close states of the first diversion port and the second diversion port in different cleaning modes.

4. The cleaning system for a semiconductor according to claim 3, wherein the liquid removing mechanism further comprises a positioning seat arranged at the mounting seat and formed on a circumferential outer side of the hollow shaft driver; and
a radially inner end edge of the first diversion wall is cooperated with a radially inner end edge of the second diversion wall to hide the first diversion port, and a radially outer end edge of the positioning seat is cooperated with the radially inner end edge of the second diversion wall to hide the second diversion port.

5. The cleaning system for a semiconductor according to claim 1, wherein the rotating mechanism further comprises a jack-up unit arranged below the transmission unit, the transmission unit is slidably connected to an inner side of the mounting seat, and the jack-up unit drives the transmission unit to ascend and descend.

6. The cleaning system for a semiconductor according to claim 1, further comprising at least two groups of cleaning mechanisms arranged on a circumferential outer side of the cavity mechanism, wherein each group of the cleaning mechanisms comprises a driving unit, a liquid storage unit and at least two spray pipes, and the driving unit controls the spray pipes to rotate between the wafer and the liquid storage unit.

7. The cleaning system for a semiconductor according to claim 1, further comprising a fan filter assembly arranged above the rotating mechanism and an air extraction assembly communicated with the cavity mechanism, air is sent into the cavity mechanism after passing through the fan filter assembly, and waste gas in the cavity mechanism is extracted through the air extraction assembly.

8. The cleaning system for a semiconductor according to claim 1, further comprising a housing, a transmission port arranged on a side of the housing a shutter plate arranged on an outer side of the transmission port, a driving cylinder for driving the shutter plate to ascend and descend, and an electrostatic eliminator arranged towards the transmission port.

* * * * *